United States Patent [19]

Gally et al.

[11] Patent Number: 4,931,693

[45] Date of Patent: Jun. 5, 1990

[54] ION BOMBARDMENT BARRIER LAYER FOR A VACUUM TUBE

[75] Inventors: Daniel Gally, Grenoble; Pierre P. Jobert, St. Egreve, both of France

[73] Assignee: Thomson-CSF, Paris, France

[21] Appl. No.: 235,323

[22] Filed: Aug. 23, 1988

Related U.S. Application Data

[63] Continuation of Ser. No. 808,517, Dec. 13, 1985, abandoned.

[30] Foreign Application Priority Data

Dec. 18, 1984 [FR] France ................................ 84 19362

[51] Int. Cl.$^5$ .......................... B05D 3/06; H01J 31/50; H01J 40/18; C23C 16/00

[52] U.S. Cl. .................................... 313/528; 313/530; 313/534; 250/213 VT; 427/39; 427/255.2

[58] Field of Search ........................ 427/38, 39, 255.2; 437/241; 250/213 VT; 313/461, 466, 473, 528, 530, 534

[56] References Cited

U.S. PATENT DOCUMENTS

| | | | |
|---|---|---|---|
| 2,303,563 | 12/1942 | Law | 427/107 |
| 3,485,666 | 12/1969 | Sterling et al. | 427/39 |
| 3,742,224 | 6/1973 | Einstein | 250/213 VT |
| 4,242,371 | 12/1980 | Galves | 427/73 |
| 4,395,438 | 7/1983 | Chiang | 427/94 |
| 4,618,541 | 10/1986 | Forouhi et al. | 427/94 |

OTHER PUBLICATIONS

Vossen et al., ed., *Thin Film Processes,* Academic Press, N.Y., 1978, pp. 342–351.

*Primary Examiner*—Norman Morgenstern
*Assistant Examiner*—Marianne Podgett
*Attorney, Agent, or Firm*—Roland Plottel

[57] ABSTRACT

An ionic bombardment barrier layer is provided for vacuum tube, said layer being formed of a stable compound of nitrogen and silicon. It is deposited by vapor phase chemical reaction activated by low temperature plasma. It finds an application in light image intensifier tubes.

12 Claims, 1 Drawing Sheet

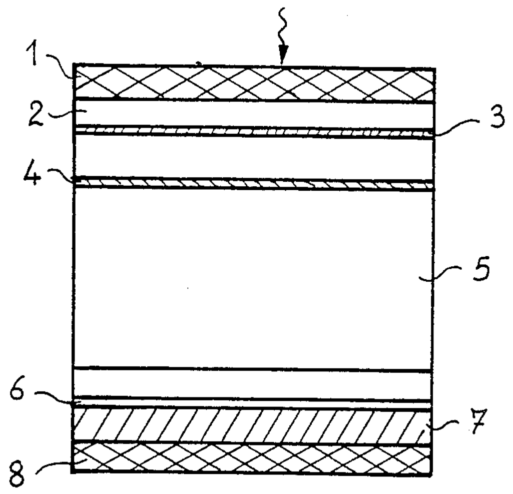
1
2
3
4
5
6
7
8

ION BOMBARDMENT BARRIER LAYER FOR A VACUUM TUBE

This application is a continuation of application Ser. No. 06/808,517, filed 12-13-85 now abandoned.

BACKGROUND OF THE INVENTION

1. Field of the Invention

The present invention relates to a layer forming a barrier to ionic bombardment for a vacuum tube.

2. Description of the Prior Art

It is known to use such layers, more especially in light image intensifier tubes.

Thus the English patent No. 1,368,882 relates to a light image intensifier tube having a slab of microchannels having on the photocathode side of the tube a layer forming a barrier to ionic bombardment. Such a tube is shown schematically in FIG. 1.

In this FIGURE, the reference 1 designates the glass plate which receives the light radiation shown symbolically by a wavy arrow.

Following this glass plate we find a photocathode 2 which is coated with a layer 3 allowing extraction of photoelectrons. We then find the ionic bombardment barrier layer 4 which is carried by the slab of microchannels 5, then a metal layer 6, a luminescent material layer 7 and a glass plate 8.

The residual pressure in a vacuum tube is never zero whatever the quality of cleaning and degassing of its component parts. The electronic bombardment ionizes the residual gases and the ions thus created, charged positively travel up the channels of the slab to the lowest potential and bombard the extraction layer 3 situated at the surface of the photocathode. This extraction layer, which is very fragile and very thin, is very rapidly destroyed by the ionic bombardment.

To avoid such destruction, an ionic bombardment barrier layer 4 is used, laid on the slab of microchannels 5, on the photocathode side. This layer stops the ions but lets through the photoelectrons which are suitably accelerated by a sufficient potential.

In the cited English patent, the process used for depositing the barrier layer is the following:

- a thin organic film, with a nitrocellulose base for example, is formed using one of the processes for manufacturing cathode ray tube screens;
- this film is deposited on the microchannel slab;
- a protective material layer, preferably a layer of aluminium, is deposited on the organic film laid on the microchannel slab;
- air annealing is carried out so as to ensure combustion of the organic film and to ensure a contact between the protective material layer and the microchannel slab.

When an aluminium barrier layer is used, adhesion of the barrier layer to the microchannel slab and the stress state of the barrier layer after annealing are not very satisfactory.

On the other hand, aluminium is a material easy to deposit and which does not give rise to degassing when it is bombarded.

For forming this barrier layer, it is known to use other materials such as alumina $Al_2O_3$, a silicon oxide $SiO_2$ or SiO, or zinc sulphide ZnS. None of these materials gives full satisfaction. Alumina has a stress state after annealing which is not very satisfactory, silicon oxide $SiO_2$ or SiO degasses when it is bombarded, and zinc sulphide has a mean atomic mass which is too larger for the photoelectrons to be able to pass readily therethrough.

In the prior art, the ionic bombardment barrier layers are deposited by well known techniques of cathode spraying or Joule effect evaporation. Such techniques have more particularly the following disadvantages:

- the organic film may be damaged;
- rotating pieces and sophisticated regulations are required for forming very thin films in a reproducible way;
- finally, heating during the different depositions is difficult to provide.

SUMMARY OF THE INVENTION

The present invention provides a barrier layer which has more satisfactory properties than the barrier layers of the prior art, more particularly with respect to the following points:

- good adhesion to the microchannel slab;
- the absence of degassing under ionic bombardment;
- a mean atomic mass small enough for the photoelectrons to be able to pass readily therethrough;
- the absence of defects such as holes or tears resulting either from the annealing and the stress state which is created or from the handlings required, for example, for fitting the microchannel slab in the light image booster.

Because of the improvement in the properties of the barrier layer, the present invention results in an image intensifier tube whose lifespan is increased.

The present invention provides an ionic bombardment barrier layer for a vacuum tube , which is formed from a stable compound of nitrogen and silicon.

The vacuum tube in which the ionic bombardment barrier layer of the invention is used may, as was mentioned above, be a light image intensifier tube.

This layer may also be used in other types of vacuum tubes, such for example as penetration screens In this type of tube, which is described for example in the U.S. Pat. No. 4,242,371 in the name of Thomson-CSF, the barrier layer of the invention is used for separating two luminescent material layers. In such use this barrier layer has the advantage of giving rise to minimum degassing when it is bombarded.

The improvement in the properties of the barrier layer formed from a stable nitrogen and silicon compound is due to several factors. It is known that when it is subjected to ionic bombardment a substance such as silica degasses by desorption of water molecules and decomposition of the hydroxyl radicals. The use of a non oxygenated material reduces the extent of degassing. It has been observed with the sweep electronic microscope that when annealing is carried out the barrier layer has a "wrinkled" appearance and presents a minimum stress state. Thus any impurity in the form of microdust or any other surface irregularity due to the preceding steps of the process create no tear in the film stretched above the orifices of the microchannel slab.

On the contrary, when a barrier layer made from silica $SiO_2$ is used, it can be observed that a stretched film is obtained after annealing which causes considerable stress conditions.

Finally, a deposition process is used by chemical reaction in the vapor phase activated by low temperature plasma which leaves the microchannel slabs immobile and reduces the handlings during the steps of depositing the protective material on the organic film and annealing. Thus annealing may be carried out in situ whereas handling was necessary in the case of cathode spraying or evaporation deposition for placing in the oven.

BRIEF DESCRIPTION OF THE DRAWINGS

Other objects, features and results of the invention will be clear from the following description given by way of non limitative example and illustrated by the accompanying FIGURE which shows the diagram of a light image intensifier tube.

In the accompanying FIGURE, for the sake of clarity, the sizes and proportions of the different elements have not been respected.

FIG. 1, which shows schematically a light image intensifier tube was described in the introduction to the description.

DESCRIPTION OF THE PREFERRED EMBODIMENT

According to the invention, the ionic bombardment barrier layer 4 is formed from a stable compound of nitrogen and silicon. It may be a compound of formula $Si_3N_4$ for example, but non stoechiometric formulae are also suitable as long as they give a stable compound.

This compound has a refraction index between 1.6 and 2.2 and preferably between 1.8 and 1.9.

Silicon nitride $Si_3N_4$ has much better characteristics than those of silica $SiO_2$ in so far as the compactness is concerned. The compactness is defined as the ratio of the specific mass to the mean atomic mass. The compactness of silicon nitride is 0.17 average moles of atom per cubic centimeter and that of silica is 0.11.

The mean atomic mass of these two materials is identical. These two materials have then a comparable permeability to electrons of the same incident energy When the barrier layer of the invention is used in a light image intensifier tube, it has a thickness of about 30 to 300 Angströms and preferably from 50 to 80 Angströms. For other applications, a layer of greater thickness may be used, of the order of a few micrometers for example.

The barrier layer of the invention is formed at a temperature between 70° and 200° C. and preferably between 120° and 150° C. A compromise must be found between the stress condition intrinsic to the material at a given temperature and the thermal plastic characteristics of the thin organic film laid on the microchannel slab.

We saw above that in the prior art methods are used for depositing barrier layers, such for example as cathode spraying or Joule effect evaporation.

Such methods relate solely to the deposition of the barrier layer. They are used for depositing the barrier layer on the thin organic film deposited on the microchannel slab and they are followed by air annealing, as was mentioned above.

In the invention, a deposition method is preferably used which is also known in the prior art, and which is carried out by plasma enhanced vapor phase chemical reaction at low temperature.

The deposition takes place in a cylindrical chamber, having two horizontal electrodes separated by a few centimeters. The microchannel slabs are placed on the lower electrode which is heated to a temperature such as was discussed above. The plasma is created in a mixture of gases having chemical formulae $SiH_4$, $NH_3$ and $N_2$. In order to reduce the deposition rate, the nitrogen $N_2$ may be diluted with silane $SiH_4$.

The microchannel slabs remain fixed during the deposition. In addition, the annealing which eliminates the organic layer may take place in situ, either in air or in any suitable gas mixture.

What is claimed is:

1. A light image intensifier vacuum tube comprising a photocathode for emitting electrons, an extraction layer over one face of the photocathode for facilitating the emission of electrons from the photocathode, a slab including microchannels spaced from the photocathode in the path of the emitted electrons, a luminescent target in the path of electrons passing through the slab, and an ionic bombardment barrier layer on the surface of the slab facing the photocathode adapted for passing the emitting electrons but for blocking ions flowing from the slab towards the photocathode comprising a layer of a stable compound of nitrogen and silicon of a thickness between 30 and 300 Angströms.

2. The vacuum tube of claim 1, wherein the compound is silicon nitride $Si_3N_4$.

3. The vacuum tube of claim 1 wherein the refraction index of the compound is between 1.6 and 2.2.

4. The vacuum tube of claim 1 wherein the refraction index of the compound is between 1.8 and 1.9.

5. The vacuum tube of claim 2 wherein the thickness of the barrier layer is between 50 and 80 Angströms.

6. A light image intensifier vacuum tube comprising an envelope in which there are included a photocathode for emitting electrons, an extraction layer over one face of the photocathode for facilitating the emission of electrons from the photocathode, a slab including the photocathode in the path of the emitted electrons, a luminescent target in the path of electrons passing through the slab, and an ionic bombardment barrier layer on the surface of the slab facing the cathode for passing the emitted electrons but blocking ions from flowing from the slab to the photocathode, characterized in that the barrier layer is a layer between 30 and 300 Angströms, which is of a stable compound of silicon and nitride with a refractive index between 1.8 and 1.9.

7. The vacuum tube of claim 6 in which the ionic bombardment layer has a thickness of between 50 and 80 Angströms.

8. The vacuum tube of claim 6 in which the stable compound is silicon nitride.

9. The vacuum tube of claim 8 in which the barrier layer has a thickness between 50 and 80 Angströms.

10. A method for the manufacture of an image intensifier vacuum tube which utilizes an ionic bombardment barrier layer over one face of a microchannel slab adapted to permit photoelectrons from a photocathode to pass through to the microchannel slab but to block ions from passing from the microchannel slab and bombarding the photocathode in which the method of forming the ionic bombardment barrier layer comprises the steps of depositing an organic film over the face of the microchannel slab where the barrier layer is to be formed, depositing by a low temperature plasma-enhanced chemical vapor phase process a layer of a compound of nitrogen and silicon of a thickness between 30 and 300 Angströms, and heating the microchannel slab for eliminating the organic film and adhering the layer of the compound of nitrogen and silicon on the face of the microchannel slab.

11. The method as claimed in claim 10, wherein the compound is $Si_3N_4$ and the deposition by vapor phase chemical reaction takes placed at a temperature between 70 and 200 C.

12. The method as claimed in claim 10, wherein the compound is $Si_3N_4$ and the chemical vapor phase deposition takes place at a temperature between 120 and 150 C.

* * * * *